United States Patent [19]

Mikkelson

[11] Patent Number: 5,001,076

[45] Date of Patent: Mar. 19, 1991

[54] PROCESS FOR FABRICATING III-V DEVICES USING A COMPOSITE DIELECTRIC LAYER

[75] Inventor: James M. Mikkelson, Thousand Oaks, Calif.

[73] Assignee: Vitesse Semiconductor Corporation, Camarillo, Calif.

[21] Appl. No.: 340,381

[22] Filed: Apr. 19, 1989

Related U.S. Application Data

[63] Continuation-in-part of Ser. No. 111,862, Oct. 23, 1987, abandoned.

[51] Int. Cl.$^5$ .................. H01L 21/314; H01L 21/338
[52] U.S. Cl. .................... 437/40; 437/184; 437/41; 437/176; 437/912; 437/56; 437/978; 437/39; 148/DIG. 43; 148/DIG. 20
[58] Field of Search ............. 437/161, 978, 912, 247, 437/177, 41, 176, 184, 40, 39; 148/DIG. 43, DIG. 20

[56] References Cited

U.S. PATENT DOCUMENTS

| | | | |
|---|---|---|---|
| 3,861,969 | 1/1975 | Ono et al. | 437/978 |
| 4,396,437 | 8/1983 | Kwok et al. | 437/912 |
| 4,855,246 | 8/1989 | Codella et al. | 437/41 |

FOREIGN PATENT DOCUMENTS

| | | | |
|---|---|---|---|
| 0102564 | 6/1983 | Japan | 437/912 |
| 0103127 | 6/1983 | Japan | 437/912 |
| 0143578 | 8/1983 | Japan | 437/912 |

OTHER PUBLICATIONS

Ghandhi, S. K., VLSI Fabrication Principles, John Wiley & Sons, 1983, pp. 418-431, 598-605.

Primary Examiner—Brian E. Hearn
Assistant Examiner—T. N. Quach
Attorney, Agent, or Firm—David W. Collins

[57] ABSTRACT

A III-V semiconductor surface (10') of a III-V substrate (10) is provided with a thick dielectric layer (40), preferably comprising a composite nitride/oxide layer (40a/40b). A layer of comparatively thin silicon nitride layer (40a) is formed on the substrate and a comparatively thicker silicon dioxide layer (40b) is formed thereover. The composite dielectric layer acts as a good ion absorber during ion implantation (54), thereby masking the substrate from ions in undersirable locations. Further, the composite dielectric layer provides appropriate contrast for alignment marks, thereby reducing the number of masking steps and the amount of gate area in FETs otherwise required to compensate for potential misalignment. The composite dielectric layer affords surface protection, which not only keeps the semiconductor clean during processing, but also provides a cap during annealing. Finally, the composite dielectric layer separates gate metal interconnects from the substrate surface, thereby reducing capacitance and undesirable substrate biasing.

12 Claims, 5 Drawing Sheets

PROCESS FOR FABRICATING III-V DEVICES USING A COMPOSITE DIELECTRIC LAYER

TECHNICAL FIELD

CROSS-REFERENCE TO RELATED APPLICATION

The present application is a continuation-in-part application of Ser. No. 07/111,862, filed Oct. 23, 1987, now abandoned.

The present invention relates to III-V semiconductor devices, such as GaAs devices, and, more particularly, to an improved device structure in which the dielectric cap for protecting the surface of the III-V wafer during processing is also employed to reduce process complexity and to lower the device parasitic capacitances.

BACKGROUND ART

As the complexity of III-V semiconductor integrated circuits increases to LSI (large scale integration) and VLSI (very large scale integration) levels, the problems of packing density and interconnect delay become important issues. To provide high speed LSI and VLSI III-V semiconductor circuits, it is necessary to reduce device and interconnect parasitic capacitances. This can be achieved by reducing distance between circuit elements and by reducing the device area. Also, the interconnect capacitance can be reduced by moving the interconnect metals away from the high permittivity substrate.

To reduce the costs and increase the availability of complex III-V integrated circuits, simple and manufacturable processes must be developed.

The process described herein meets these needs by reducing the number of masking, deposition, and etching steps needed to fabricate GaAs enhancement and depletion mode transistors and integrated circuits. In addition, the process increases circuit speed and density by reducing layout overlap tolerances and parasitic capacitances. The capacitance of gate metal interconnection lines is reduced by approximately 40% over previous process techniques. The area required to fabricate a typical device is reduced by about 30 to 50%.

In the conventional fabrication of III-V FET (field effect transistor) devices, specifically GaAs FETs, alignment marks are etched into the semiconductor substrate. A mask is aligned to the marks and implantation (for either depletion or enhancement mode device) is performed. The implant mask is commonly photoresist, which is stripped after the implant. A new mask is aligned to the marks and a second implant (enhancement or depletion) is performed.

The problem with this approach is that misalignment can occur during the placement of either mask. This in turn requires a large overlap for the gate in order to accommodate potential misalignment.

Second, the process of stripping one mask and adding a second mask permits contamination of the GaAs surface. Such contamination can lead to poor transistor operation or early device failure.

Silicon nitride or silicon dioxide are often used as capping layers during annealing to prevent loss of gallium or arsenic. However, they are used only during such operations, and are removed prior to gate metallization. The gate metallization lines are then run on the surface of the substrate. It has been demonstrated that contact of the GaAs substrate by gate metallization causes detrimental effects such as backgating and low frequency oscillations.

Thus, a means of protecting the III-V semiconductor surface from contamination while at the same time preventing gate metal contact with the substrate and also avoiding misalignment problems and reducing the number of masking steps is required.

DISCLOSURE OF INVENTION

In accordance with the invention, the III-V semiconductor surface is provided with a thick dielectric layer. In one embodiment, the dielectric layer may comprise a composite nitride/oxide layer. For example, a layer of comparatively thin silicon nitride layer is formed on the substrate and a comparatively thicker silicon dioxide layer is formed thereover.

The dielectric layer acts as a good ion absorber during ion implantation, thereby masking the substrate from ions in undesirable locations. Further, the dielectric layer provides appropriate contrast for alignment marks, thereby reducing the amount of gate area otherwise required to compensate for potential misalignment. Also, a reduction in the number of masking steps is achieved.

The dielectric layer of the invention affords surface protection, which not only keeps the surface clean during processing, but also provides a cap to protect the GaAs in the field regions during annealing, acts as an implant mask for channel and source and drain formation, and separates gate metal interconnects from the substrate surface.

BEST MODES FOR CARRYING OUT THE INVENTION

While the description below is specifically directed to gallium arsenide (GaAs) devices, it will be appreciated that other III-V devices will similarly benefit from the teachings of the invention. Further, a specific class of devices is discussed, namely, field effect transistors (FETs), which comprise depletion and enhancement mode devices, each comprising source and drain regions separated by a channel region contacted by a gate. In such devices, an ohmic metal contacts the source and drain regions, while a Schottky gate metal contacts the channel region. However, the teachings of the invention apply to other devices where surface contamination and/or misalignment is of concern.

The GaAs substrate typically comprises semi-insulating GaAs, such as obtained with undoped or chromium-doped gallium arsenide. However, other insulating, semi-insulating, or semiconducting III-V substrates may also be employed in the practice of the invention.

Referring now to the drawings, wherein like numerals of reference designate like elements throughout, FIG. 1 shows the conventional sequence used to fabricate GaAs MESFETs for integrated circuits. In FIG. 1a, the GaAs substrate 10 has been coated with photoresist 12, in which openings 14 have been exposed for the transistor channel regions 16. The channel regions 16 have been implanted using the photoresist as an implant stop mask.

Figure 1A:
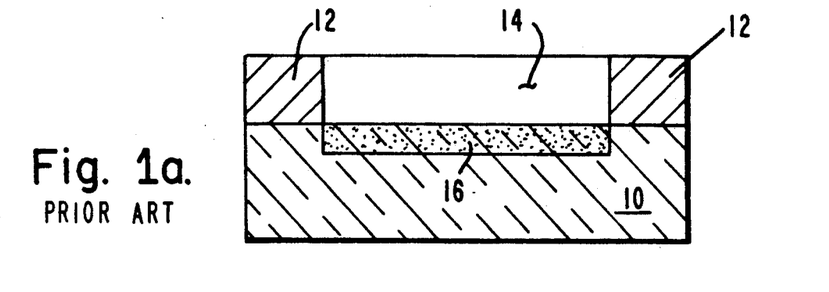
FIGS. 1a–e are cross-sectional views, depicting the conventional, prior art sequence used to fabricate GaAs enhancement mode or depletion mode MESFETs for integrated circuits.
Figure 1B:
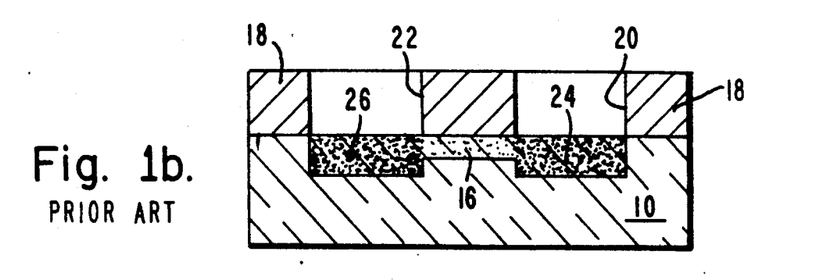

The photoresist layer 12 is removed and the substrate is coated with a new photoresist layer 18. As shown in FIG. 1b, the photoresist layer 18 is patterned to create source openings 20 and drain openings 22. Source 24 and drain 26 regions are implanted with the photoresist 18 being used as an implant mask. The photoresist is again removed, and the substrate is annealed to remove the implant damage and to make the implanted impurities electrically active.

Figure 1C:
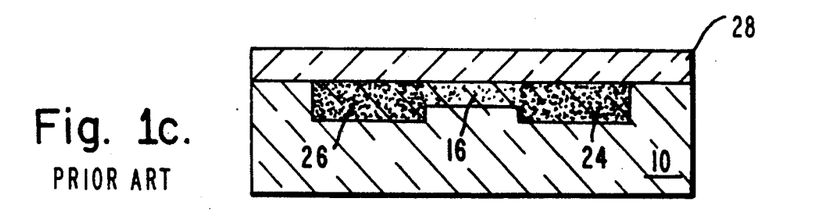
Figure 1D:
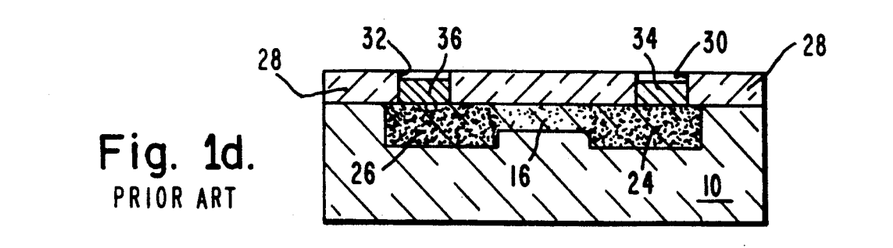

As illustrated in FIG. 1c, the substrate 10 is next coated with a dielectric layer 28. The dielectric layer is patterned and etched with a conventional photoresist process, as shown in FIG. 1d. Openings 30 and 32 are created in both the photoresist (not shown) and the dielectric to expose the source 24 and drain 26 regions, respectively. A layer of ohmic contact metal is deposited over the photoresist and openings. The metal is patterned by removal of the photoresist and overlying metal by the conventional dielectric assisted lift-off process. The resulting source ohmic contact 34 and drain ohmic contact 36 are shown in FIG. 1d. The substrate 10 is again annealed to form the ohmic contacts.

Figure 1E:
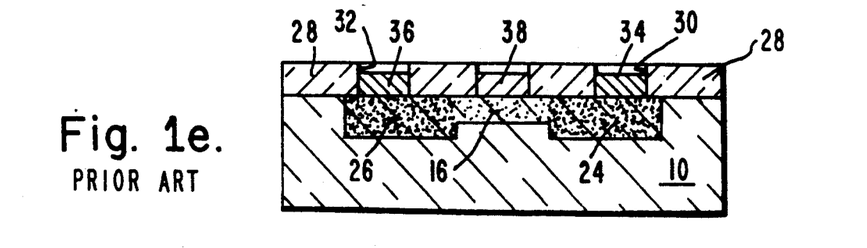

Similarly, the dielectric layer 28 is again patterned, and the gate metal 38 is defined by a lift-off process, producing the completed device shown in FIG. 1e.

Five masking levels, fiducial alignment mask (not shown), channel implant mask, source and drain implant mask, contact mask, and gate mask are required to fabricate this device. Subsequently, additional layers of dielectrics and metals can be deposited and patterned to form the interconnections between the circuit elements.

FIG. 2 illustrates the fabrication sequence of the invention in cross-section. In FIG. 2, the substrate 10 is coated with a composite dielectric layer 40 comprising a layer 40a of $Si_3N_4$ and a layer 40b of $SiO_2$. The composite dielectric layer is patterned and etched, employing a photoresist layer (not shown) to provide openings 42 to the substrate surface 10', as shown in FIG. 2b. These openings define the active device regions. The photoresist is removed and the channel region 16 is implanted using the composite dielectric layer 40 as an implant stop mask.

Figure 2A:
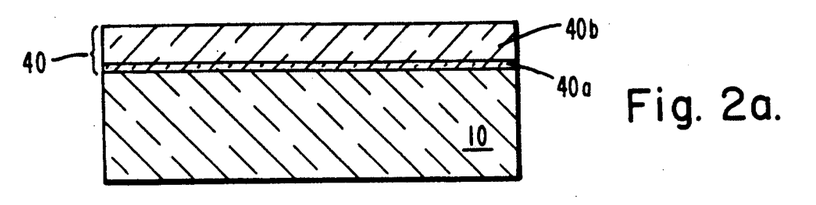
FIGS. 2a–e are cross-sectional views, depicting the sequence in accordance with the invention for fabricating GaAs enhancement mode or depletion mode MESFETs for integrated circuits.
Figure 2B:
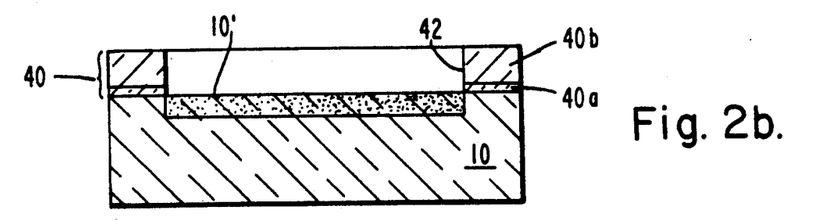
Figure 2C:
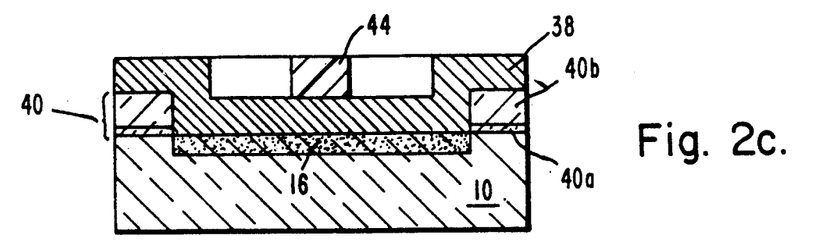

The entire substrate is next coated with gate metal 38. Photoresist 44 is deposited and patterned over the gate metal to define the transistor gates and also gate metal interconnect lines. FIG. 2c shows the device after the photoresist has been patterned.

Figure 2D:
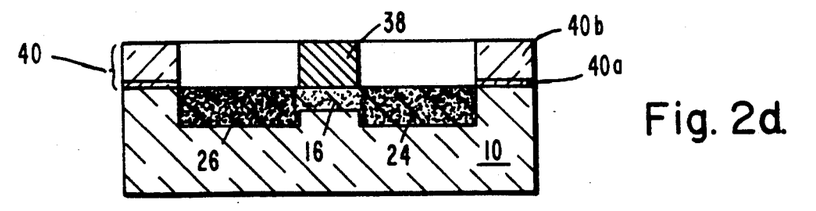
Figure 2E:
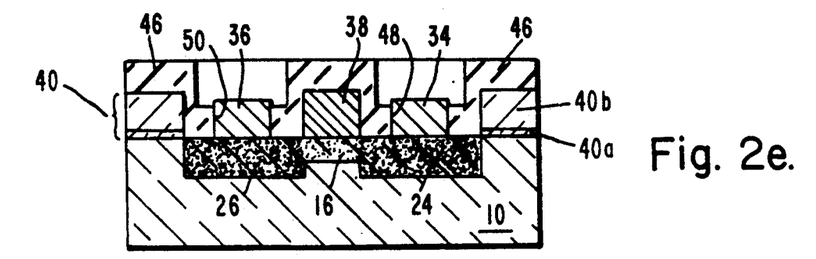

The gate metal 38 is etched and the photoresist 44 is removed to leave the gate electrode 38 on the semiconductor surface, as shown in FIG. 2d. The source regions 24 and the drain regions 26 are implanted using the composite dielectric layer 40 and the gate metal electrode 38 as the implant stop mask to define the device dimensions. After implanting the source and drain regions, the substrate is annealed to remove implant damage and to make the implanted impurities electrically active.

Subsequently, a dielectric layer 46 is deposited over the entire substrate. The substrate is covered with photoresist (not shown) and the dielectric layer 46 is patterned and etched to provide openings for the source and drain ohmic contact metal. The source ohmic contact metal 34 and the drain ohmic contact metal 36 are patterned by the lift-off method, resulting in the device structure shown in FIG. 2e. In this case, only three masking steps, active area mask, gate metal mask, and ohmic contact mask, are required to fabricate the transistor. Additional layers of dielectrics and metals can be deposited and patterned to provide the interconnections between the circuit elements.

In the case of the prior art process and devices described in FIG. 1, the gate metal 38, which is defined by a dielectric assisted lift-off process through the surface dielectric layer 28, contacts the substrate 10 everywhere the gate metal is present. In the case of the process of the invention shown in FIG. 2, the dielectric layer 40 isolates the gate metal from the substrate everywhere but in the active device area, as shown in FIG. 5.

FIGS. 3 and 4 are plan view comparisons of the prior art process (FIGS. 3a-e) and the process of the invention (FIGS. 4a-e) when they are used to fabricate both enhancement mode and depletion mode devioes. The reduction of overall device size for the process of the invention is demonstrated by identical layout and overlap rules for each process.

FIGS. 3a-e demonstrate the six mask sequence required to fabricate both enhancement (e) and depletion (d) mode MESFETs in the prior art process. The initial alignment mark 100 is patterned onto the wafer by etching a metal film on the substrate or by etching into the substrate through a photoresist mask. This alignment mark mask is often referred to as mask 0. The ideal placement of the device level masks is illustrated by the dashed rectangle 105 in FIGS. 3a-e.

Figure 3A:
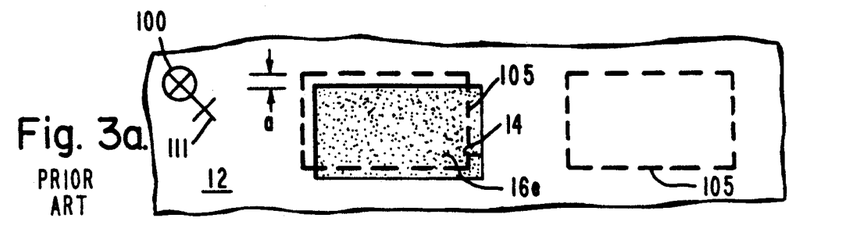
FIGS. 3a–e are top plan views depicting the six mask sequence required in the prior art to fabricate both enhancement and depletion mode MESFETs.
Figure 3B:
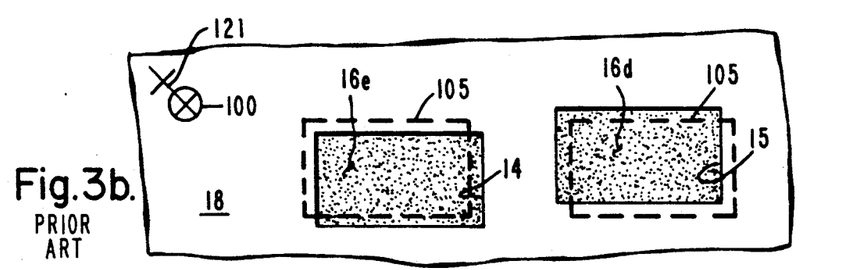

The first device level mask, seen in FIG. 3a, which defines the enhancement channel regions 14, is opened in the photoresist. The impurities for the enhancement transistors are implanted through this opening to form the enhancement channel region 16e. The misalignment of the first device mask is shown by the alignment mark 111.

After removing the photoresist, another photoresist layer is coated on the wafer and the depletion device openings 15 are created in the photoresist, as shown in FIG. 3a. The depletion region implant 16d is done through the openings 15. The misalignment of the depletion implant mask is illustrated by its alignment mark 121. It will be noted that either the enhancement device region 16e or the depletion device region 16d can be outside the desired device region 105 in any direction by one alignment tolerance a.

Figure 3C:
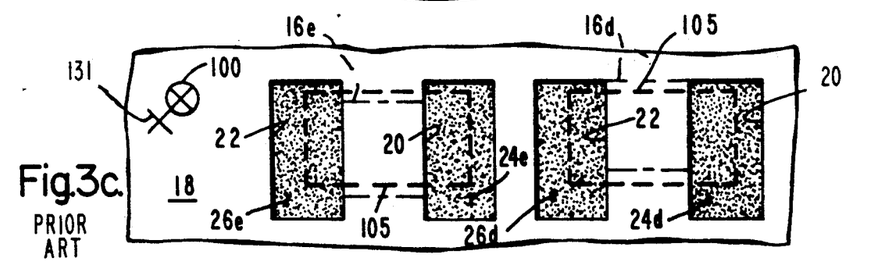
Figure 3D:
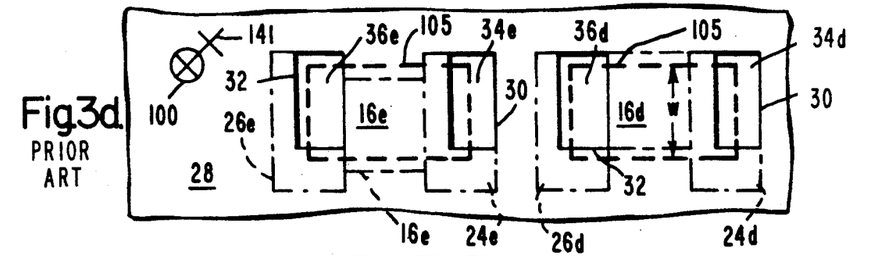

In order to guarantee that the source implant region 20 and the drain implant region 22 completely cover the possible locations of the device channel regions in the worst misalignment case, the source and drain openings 20 and 22 must be 2a wider than the channel width in each direction. Such a worst case misalignment is illustrated in FIG. 3c, where the source and drain mask of the enhancement device is misaligned in the opposite direction from the depletion region mask. Alignment marks 121 and 131 are misaligned on opposite sides of the reference mark 100. The source region implant 24 and the drain region implant 26 are performed with a photoresist implant stop mask, as previously illustrated in FIG. 1b.

After a dielectric layer 28 is deposited (seen in FIG. 1c) and the source ohmic contact metal opening 30 and drain ohmic contact metal opening 32 are created in another photoresist layer, the dielectric is etched and the source ohmic contact metal 34 and the drain ohmic contact metal 36 are patterned by the lift-off process. To guarantee that the ohmic contact metal does not extend beyond the source and drain implanted regions 24 and 26, the width of the ohmic contact metal must be restricted to be less than or equal to the active device width W. Again, the worst case misalignment between the source and drain implant mask and the ohmic metal mask is illustrated by the alignment marks 131 and 141 in FIGS. 3c and 3d.

Figure 3E:
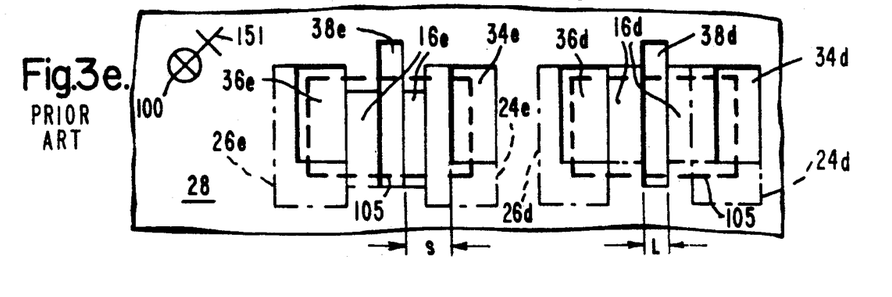

The gate metal 38 is patterned by another photoresist and lift-off step, as illustrated in FIG. 3e. Because the gate metal 38 can be misaligned from the device region 16 by two alignment tolerances, the gate width must be $W+4a$. Such a misalignment is shown in FIG. 3e and illustrated by the difference between alignment marks 111 and 151. The minimum device size for such a process is $(W+6a) \times (2s+L+6a)$, where s is the minimum spacing required between the ohmic contact metal 34, 36 and the gate electrode 38.

Because the gate electrode 38 and the source junction 26 and the drain junction 28 are larger than the equivalent elements in the process of the invention, the new process produces devices which have a significant reduction in parasitic capacitances. These reductions lead to improved speed. The reduced device size leads to smaller circuits with reduced interconnection capacitances.

FIGS. 4a-e demonstrate the four mask sequences required to fabricate both enhancement (e) and depletion (d) mode MESFETs in the new process.

Figure 4A:
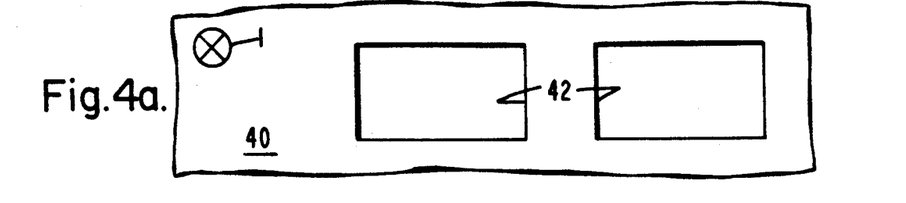
FIGS. 4a–e are top plan views depicting the four mask sequence required to fabricate both enhancement and depletion mode MESFETs in accordance with the process of the invention.

In FIG. 4a, the alignment mark 1 is created with the same mask as the active area openings 42 in the dielectric 40. This allows subsequent layers to be aligned directly to the device area rather than to an alignment mark level typical of other processes.

Figure 4B:
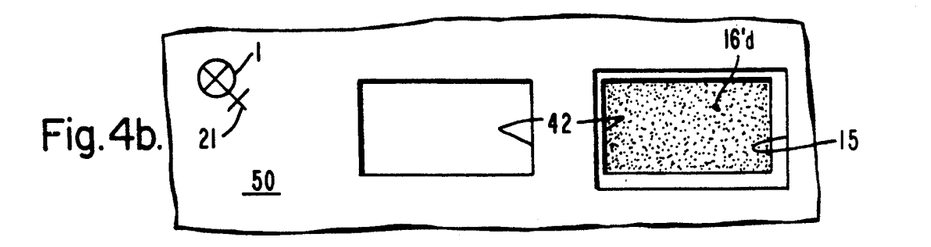
Figure 4C:
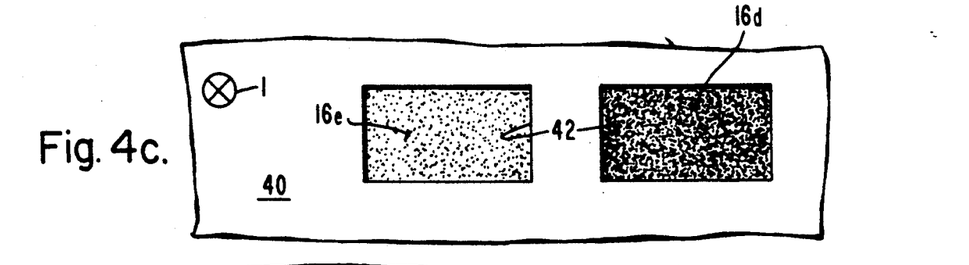

In FIG. 4b, the misalignment of the second mask level is shown by the offset of the second level alignment mark 21 to the active area alignment mark 1. The second mask level is patterned in a photoresist layer 50, creating openings 15 in the photoresist to expose substrate areas for the depletion device channel implant. The photoresist is not exposed in areas where the enhancement devices are to be. Since the dielectric layer acts as an implant stop mask, the dimensions and alignment of the depletion device openings are non-critical, as long as the entire active area opening 42 is uncovered, as shown in FIG. 4b. The depletion devices 16d are implanted through the openings 15 and the photoresist is removed. At this point, the enhancement device channels have not been implanted, as shown in FIG. 4b. Next, the enhancement device channels 16e and depletion device channels 16d are both implanted into the active area openings 42, using the dielectric layer 40 as an implant stop mask. This creates the enhancement channel doping in the enhancement regions 16e and an increased and final depletion channel doping in the depletion regions 16d.

Figure 4D:
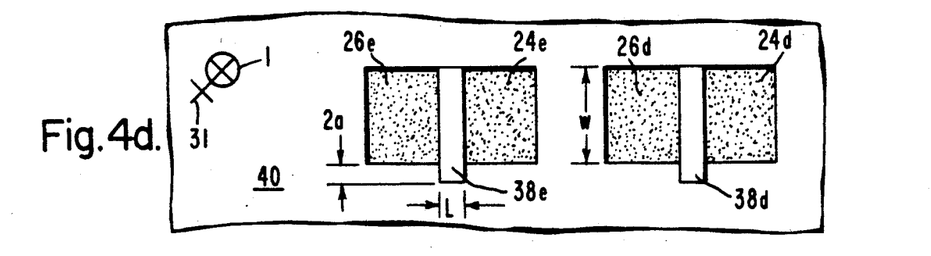

In FIG. 4d, the misalignment of the third mask level is shown by the offset of the third level alignment mark 31 to the active area alignment mark 1. The gate electrodes 38e and 38d are shown with their worst case misalignment to the active area opening 42. At the worst misalignment, the gate electrode must completely cover the width direction of the active area opening. This requires that the gate electrode,s width be equal to W, the width of the active area opening, plus $2a$, where a is the worst case misalignment in the W direction. For simplicity of illustration, all misalignments are assumed to be the same for all levels. As illustrated in FIG. 4d, the source regions 24e and 24d and the drain regions 26e and 26d are implanted using the dielectric layer 40 and the gate electrodes 38e and 38d as implant stop masks.

Figure 4E:
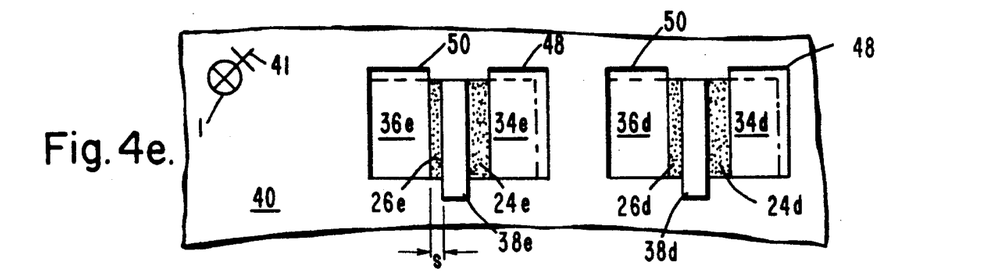

FIG. 4e shows the completed device. Openings 48 for the source ohmic metal 34e and 34d and openings 50 for the drain ohmic metal 36e and 36d are created through a fourth photoresist mask and another dielectric layer 46 as shown previously in FIG. 2. Significant leakage currents would occur if the ohmic contact metal were allowed to contact the unimplanted substrate regions. Because the dielectric layer 40 prevents such contact, the size and alignment of the ohmic contact openings 48, 50 are non-critical, and overlap of the ohmic contact metal outside the active region is allowed. The misalignment of the contact mask represented by its alignment mark 41 to the active area opening is shown in FIG. 4e. To guarantee ohmic contacts the full width of the device, the contacts need a width $W+2a$. The total required width to produce the device is then $W+4a$.

A minimum spacing s is required between the ohmic contact metal 34, 36 and the gate electrode 38. For the alignment scheme shown in FIG. 4d, the spacing between the source ohmic metal opening 48 and the drain ohmic metal opening 50 is $2s+4a+L$, where L is the gate electrode length and s is the spacing between the source/drain electrode and the gate metal. The total length of the device would be $2s+4a+L+2c$, where c is the contact length.

Alternatively, mask 4 could have been aligned to a new alignment mark created at mask 3. The maximum misalignment between the gate electrode 38 and the ohmic contact metal openings 48, 50 would be reduced from 2a to a. The spacing between the source ohmic metal opening 48 and the gate ohmic metal opening 50 would be reduced to $2s+2a+L$, while the width of the ohmic metal would be increased to $W+3a$. The device area for the first alignment scheme is $(2s+4a+L+2c) \times (W+4a)$, while the area for the second alignment scheme is $(2s+3a+L+2c) \times (W+5a)$.

Turning now to the details of the process of the invention, as shown in FIGS. 5a-d, the dielectric layer 40 preferably comprises a relatively thin layer 40a of silicon nitride, over which a relatively thick layer 40b of silicon dioxide is formed. The presence of the $Si_3N_4$ layer 40a prevents out-diffusion of gallium or arsenic from the GaAs surface 10'. The presence of the $SiO_2$ layer 40b acts to stop ions from penetrating the GaAs surface 10 during ion implantation and provides an appropriate contrast for alignment marks.

The silicon nitride layer 40a is formed to a thickness of about 100 to 1,000 Å. The lower limit is constrained by the desire to avoid pinhole formation associated with thinner layers, which would permit gallium diffusion, while the upper limit is constrained by stresses associated with thicker layers. Preferably, the thickness of the silicon nitride layer 40a ranges from about 300 to 500 Å.

The silicon nitride layer 40a is conveniently formed by plasma chemical vapor deposition (CVD) of silane-/ammonia, although other well-known deposition processes may be employed. The temperature of the plasma deposition ranges from about 200° to 600° C. The lower limit is constrained by the need to control stress and film quality, which degrades at lower temperatures, while the upper limit is constrained by substrate decomposition. Preferably, the CVD deposition is carried out at about 380° C.

The silicon dioxide layer 40b is formed to a thickness of about 1,000 to 7,000 Å, and preferably to a thickness of about 3,500 Å. Advantageously, the layer is deposited in the same plasma apparatus used to deposit the silicon nitride layer 40a. The same deposition temperature is conveniently employed. The deposition reaction is by CVD of silane/nitrous oxide.

The silicon dioxide layer 40b should be thick enough to stop ions used in ion implantation processes in gallium arsenide. Its maximum thickness is constrained by the economics of etching through to underlying layers and step coverage of subsequent metallizations.

While the composite layer 40 could comprise only silicon nitride 40a, problems with stress arise at thicknesses greater than about 1,000 Å. These stresses are created due to a mismatch in the thermal coefficient of expansion of silicon nitride and gallium arsenide.

Alternatively, the dielectric layer 40 could comprise only silicon dioxide, or, indeed, any suitable dielectric material. On the other hand, since silicon nitride and silicon dioxide are well-characterized materials, they are preferred. Indeed, in an alternative embodiment, the dielectric layer 40 may comprise a composite material such as silicon oxynitride (composite in composition), which combines the favorable properties of silicon dioxide and silicon nitride. However, for the reasons given above, the dielectric layer 40 most preferably comprises a composite structure combining a first layer 40a of silicon nitride and a second layer 40b of silicon dioxide.

Portions of the dielectric layer 40 are etched to expose corresponding portions of the underlying semiconductor surface 10. The etching is performed by conventional processes through a photoresist layer (not shown) which has been suitably patterned.

Typically, a dry plasma etch is used to partially etch through the oxide layer 40b. The dry etch may employ the well-known $C_2F_6+CHF_3+O_2$ system, which is an anisotropic etchant. The dry plasma etch is followed by a wet etch, which naturally stops at the silicon nitride/silicon dioxide interface 40′. An example of such an etchant is buffered HF. Finally, a second wet etch is used to etch through the silicon nitride layer 40a, stopping at the gallium arsenide/silicon nitride interface 10′. An example of such a second etchant is hot phosphoric acid.

The dry plasma etch results in openings 42 in the oxide layer 40b having a tapered slope. The foregoing etch process avoids leaving fluorocarbon polymers on the exposed portions of the semiconductor surface 10′, which would arise from use of the dry plasma etch alone. Both wet etches are highly selective, and etch only the respective oxide or nitride.

Alternatively, it is possible to dry etch completely through to the gallium arsenide layer and then to remove the polymer.

Figure 5A:
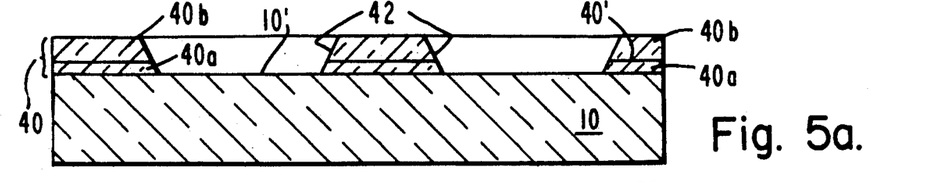
FIGS. 5a–d are cross-sectional views, depicting the sequence in accordance with the invention for fabricating MESFETs for integrated circuits.
Figure 5B:
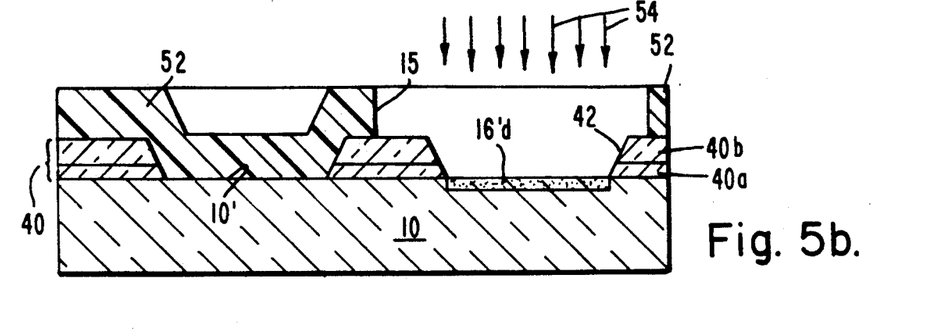

At this point, a photoresist layer 50 is applied to the structure, and openings 15 in the photoresist layer are made to semiconductor surface 10′ for implantation, as shown in FIG. 5b. The layer of photoresist remains in those regions wherein no first ion implant is desired. Alignment marks 1 (seen in FIG. 4b) are used to align the mask, as is conventional.

The alignment marks are merely etched patterns in the dielectric layer. The thickness of the layer is chosen to provide optical contrast for the aligner (as previously stated). The alignment marks are part of the ion implantation pattern etched in the layer 40.

The mask is aligned to the wafer by placing a similar pattern on the mask directly over the alignment marks. Aligning to openings in a dielectric layer is very common. In typical GaAs processing, the alignment marks are created by either etching patterns into the substrate or depositing a film (usually metal) and then patterning the film. Both of these methods, however, require an extra masking step. The use of the dielectric layer 40 of the invention avoids this extra masking step.

The depletion-mode and enhancement-mode devices are next formed, using a sequence of ion implantations.

The first implant, indicated by arrows 54, is to partially form the transistor channels 16d in the depletion-mode regions 56 in the GaAs substrate 10. As is conventional, an ionic species, such as silicon or selenium, is employed for the ion implantation. In the case of silicon, the implantation is carried out at an implant energy ranging from about 25 to 200 keV to provide an impurity dose of about $10^{11}$ to $10^{15}$ ions cm$^{-2}$. For example, a silicon implant of about $2\times10^{12}$ ions cm$^{-2}$ at an energy of about 40 keV is suitably employed.

The photoresist mask 50 is stripped and a second implant is performed into all openings in the composite layer 40.

Figure 5C:
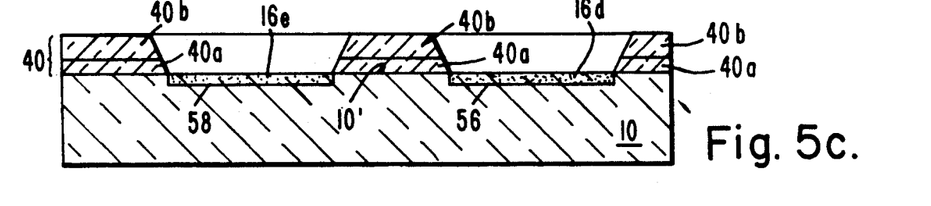
Figure 5D:
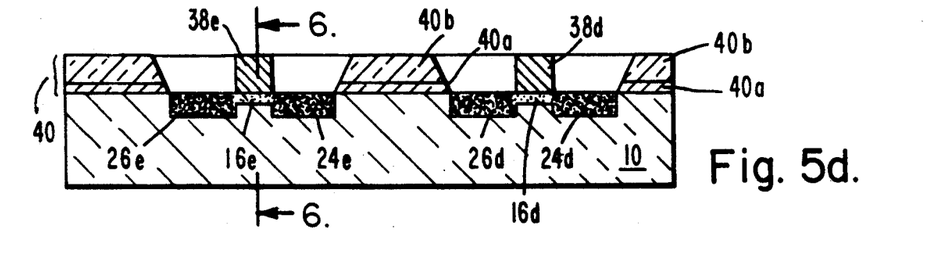

The second implant is to form the enhancement-mode channels 16e and the final depletion-mode channels 16d in the enhancement-mode regions 58 and the depletion-mode regions 56, respectively, in the GaAs substrate 10, as shown in FIG. 5c. As is conventional, an ionic species, again, silicon or selenium, is employed for the ion implantation. The implantation is carried out over substantially the same range as above, but under conditions so as to obtain a dose approximately half that of the final depletion-mode regions. For example, a silicon implant of about $2\times10^{12}$ ions cm$^{-2}$ at an energy of about 40 keV is suitably employed.

Because the enhancement implant dose is smaller than the depletion implant dose, the depletion devices are created by over-doping of the enhancement devices. The dielectric layer 40 allows the elimination of the photoresist step normally associated with the formation of enhancement mode devices, reducing both the processing cost and contamination potential.

If additional threshold voltage devices are desired, additional masking and implantation steps can be performed in a manner analogous to the depletion implant. While n-channel FETs are specifically discussed above, the teachings of the invention may also be followed to fabricate p-channel FETs, using as p-type implant ions magnesium or beryllium.

In all instances, the parameters for ion implantation are conventional, as is the nature of the photoresist, its composition, and its thickness.

Figure 6:
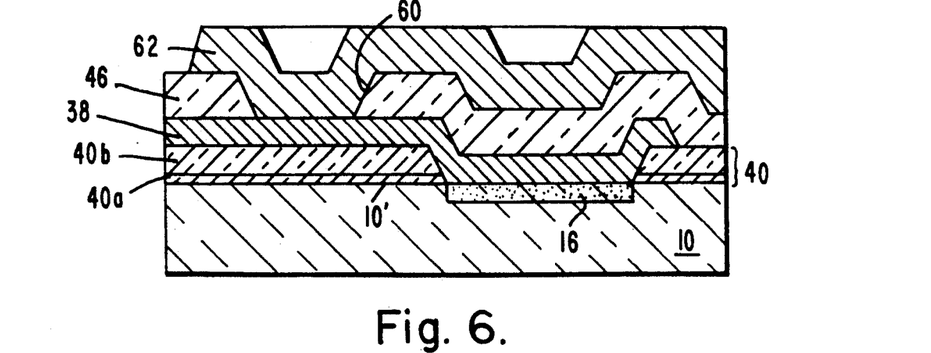
FIG. 6 is a cross-sectional view, taken along the line 6—6 of FIG. 5d, showing separation of the gate metal interconnect layer from the semiconductor substrate.

Gates 38d, 38e are then formed to contact the respective channel regions 16d, 16e in the depletion mode 56 and enhancement mode regions 58, respectively. Because the gate metallization only contacts the semiconductor substrate in the active regions created in the dielectric openings, the gate metallization is elsewhere physically and electrically isolated from the substrate by the composite dielectric layer 40 (as seen in FIG. 6). The gate metal 38 can be used for device interconnection without the previously observed problems which occur when the gate metal contacts the non-active, or field, regions of the substrate 10.

The processing continues with the formation of source 24d and drain 26d regions within the depletion mode region 56 and source 24e and drain 24e regions within the enhancement mode region 58. Again, due to the dielectric layer 40, no additional masking step is needed to form these regions, as would be required in conventional processing. The source and drain regions are self-aligned to the gate electrodes.

Next, ohmic contacts 34 and 36 (seen in FIG. 2e) to the source 24 and drain 26 regions, respectively, are formed. Interconnects to the ohmic contacts and gate metallizations are formed, as is conventionally practiced in the art. It will be appreciated that the dielectric layer 40 provides a facile approach to keeping the gate metal interconnects from contacting the semiconductor surface 10'.

FIG. 6 depicts the use of the dielectric layer 40 for separating interconnects from the semiconductor surface 10'. In particular, an interlayer 46 comprising a dielectric material, such as silicon dioxide, silicon nitride or polyimide, is deposited and patterned, as is conventional, to form openings 60, exposing a portion of the gate metal 38. Another interconnect metal 62 is then deposited and patterned, as is conventional, which contacts the gate metal 38.

It will be seen that the dielectric layer 40 of the invention is left in the field (non-transistor) areas of the circuit throughout the process, in contrast to prior art approaches. The active devices (transistors and diode) are the only circuit elements which actually touch the surface 10' of the substrate 10. No interconnection lines are run on the surface 10, of the substrate 10.

The advantages provided by the dielectric layer 40 of the invention are reduced process complexity, improved noise margins, and better device matching. The dielectric layer 40 allows a controlled surface potential everywhere by fixing the surface state density. Interconnect capacitance and cross-talk are reduced because the dielectric layer 40 moves the gate metallization off surface 10' of the substrate 10. Photoconductive effects and line-to-line leakage between gate metal lines 38 are eliminated by the insulating dielectric layer 40. Local substrate bias, an important consideration for backgating, is not controlled by the gate metal potential when the gate metal lines 38 are not run directly on the substrate surface 10'.

Because the dielectric layer 40 is used to define the active transistor area as an implant mask, the widths of enhancement and depletion mode devices are very accurately matched, since they are defined by the same mask. No masking step or critical alignment of source and drain implant is necessary, because the dielectric layer 10 also acts as an implant stop for that implant. Overlaps are significantly reduced by use of the teachings of the invention so that both operating speed and circuit density can be increased. The dielectric layer isolates gate metal interconnection lines from the substrate, eliminating detrimental effects and reducing circuit size.

The new process, with fewer masking steps and less critical alignment tolerances at mask levels two and four, provides lower fabrication cost and higher circuit yield than previous processes.

INDUSTRIAL APPLICABILITY

The formation of the dielectric layer disclosed herein on III-V semiconductor surfaces is expected to find use for protecting the underlying semiconductor surface against contamination and for providing a mask for ion implantation. The dielectric layer also serves as a cap for prevention of loss of gallium or arsenic during annealing. The dielectric layer isolates gate metal interconnection lines from the substrate, eliminating detrimental effects and reducing circuit size.

Thus, there has been provided a dielectric layer for isolating a portion of the gate metal in III-V MESFET devices from the substrate. The dielectric layer preferably comprises a composite layer of silicon nitride and silicon dioxide for protecting the semiconductor surface.

Various changes and modifications of an obvious nature may be made without departing from the spirit and scope of the invention, and all such changes and modifications are considered to fall within the scope of the invention as defined by the appended claims.

What is claimed is:

1. A process for fabricating enhancement and depletion mode devices on III-V semiconductor substrates including:
   (a) forming a composite dielectric layer on a major surface of said substrate, said composite dielectric layer comprising a first layer of silicon nitride formed on said substrate and a second layer of silicon dioxide formed on said first layer of silicon nitride;
   (b) patterning and etching said dielectric layer to provide openings exposing portions of said substrate surface;
   (c) forming channel regions in said openings;
   (d) forming schottky gate metal contacts to said channel regions and simultaneously forming extensions thereto, said extensions supported above said semiconductor substrate by said composite dielectric layer;
   (e) forming source and drain regions in said openings, with said channel region therebetween;
   (f) forming ohmic contacts to said source and drain regions;
   (g) forming interconnections with extensions of said schottky gate metal contacts, said interconnections supported above said semiconductor substrate by said composite dielectric layer; and
   (h) aligning subsequent processing steps to said openings in said dielectric layer.

2. The process of claim 1 wherein said semiconductor substrate comprises gallium arsenide.

3. The process of claim 1 wherein said first layer of silicon nitride is formed to a thickness of about 100 to 1,000 Å and second layer of silicon dioxide is formed to a thickness of about 1,000 to 7,000 Å.

4. The process of claim 3 wherein said first layer of silicon nitride is formed to a thickness of about 300 to 500 Å.

5. The process of claim 3 wherein said layer of silicon dioxide is formed to a thickness of about 3,500 Å.

6. A process for fabricating III-V semiconductor devices on a III-V semiconductor substrate, including:
   (a) forming a composite dielectric layer on a major surface of said semiconductor substrate, said composite dielectric layer comprising a first layer of silicon nitride formed on said surface and a second layer of silicon dioxide formed on said first layer of silicon nitride;

(b) etching portions of said composite dielectric layer to expose of said semiconductor surface and to define active device areas;

(c) ion-implanting a first group of channel regions within some of said active device areas to form depletion mode device channels;

(d) ion-implanting a second group of channel regions within other of said active device areas to form enhancement mode device channels;

(e) forming and patterning a Schottky gate metal to define source, channel, and drain portions within each said active device area, each said Schottky gate metal contacting said channel portions and provided with an extension supported above said semiconductor substrate by said composite dielectric layer;

(f) ion-implanting said source and drain portions within each said active device to form source and drain regions in said semiconductor surface;

(g) forming ohmic contacts to said source and drain regions;

(h) forming interconnections with extensions of said Schottky gate metal contacts, said interconnections supported above said semiconductor substrate by said composite dielectric layer; and (i) aligning subsequent processing steps to said openings in said dielectric layer.

7. The process of claim 6 wherein said semiconductor comprises gallium arsenide.

8. The process of claim 6 wherein said first layer of silicon nitride is formed to a thickness of about 100 to 1,000 Å and said second layer of silicon dioxide is formed to a thickness of about 1,000 to 7,000 Å.

9. The process of claim 8 wherein said first layer of silicon nitride is formed to a thickness of about 300 to 500 Å and wherein said layer of silicon dioxide is formed to a thickness of about 3,500 Å.

10. The process of claim 6 wherein said portions of said composite dieletric layer are etched by a process which comprises:

(a) partially etching portions of said second layer of silicon dioxide by a dry etch;

(b) completely etching said portions of said second layer of silicon dioxide to expose underlying portions of said first layer of silicon nitride; and (c) completely etching said underlying portions of said first layer of silicon nitride by a wet etch which is selective to silicon nitride to expose underlying portions of said semiconductor substrate.

11. The process of claim 6 wherein said first ionic species comprises silicon or selenium, implanted to a doping level of about $10^{11}$ to $10^{15}$ at an energy of about 25 to 200 keV, used to form depletion mode devices.

12. The process of claim 6 wherein said second ionic species comprises silicon or selenium, implanted to a doping level of about $10^{11}$ to $10^{15}$ at an energy of about 25 to 200 keV and about half that of the doping level of said first ionic species, used to form enhancement mode devices.

* * * * *